US010629795B2

(12) United States Patent
Azzouz et al.

(10) Patent No.: US 10,629,795 B2
(45) Date of Patent: Apr. 21, 2020

(54) THERMOELECTRIC MODULE AND DEVICE, IN PARTICULAR FOR GENERATING AN ELECTRIC CURRENT IN A MOTOR VEHICLE

(71) Applicant: Valeo Systemes Thermiques, Le Mesnil Saint Denis (FR)

(72) Inventors: Kamel Azzouz, Le Mesnil Saint Denis (FR); Patrick Boisselle, Le Mesnil Saint Denis (FR); Cedric De Vaulx, Le Mesnil Saint Denis (FR); Véronique Monnet, Le Mesnil Saint Denis (FR); Ambroise Servantie, Le Mesnil Saint Denis (FR)

(73) Assignee: Valeo Systemes Thermiques, Le Mesnil Saint Denis (FR)

( * ) Notice: Subject to any disclaimer, the term of this patent is extended or adjusted under 35 U.S.C. 154(b) by 44 days.

(21) Appl. No.: 15/760,197

(22) PCT Filed: Sep. 9, 2016

(86) PCT No.: PCT/FR2016/052255
§ 371 (c)(1),
(2) Date: Aug. 7, 2018

(87) PCT Pub. No.: WO2017/046483
PCT Pub. Date: Mar. 23, 2017

(65) Prior Publication Data
US 2018/0351067 A1 Dec. 6, 2018

(30) Foreign Application Priority Data
Sep. 15, 2015 (FR) ..................... 15 58646

(51) Int. Cl.
*H01L 35/32* (2006.01)
*F01N 5/02* (2006.01)
(Continued)

(52) U.S. Cl.
CPC ............. *H01L 35/32* (2013.01); *F01N 5/025* (2013.01); *H01L 35/02* (2013.01); *H01L 35/30* (2013.01); *F01N 3/046* (2013.01)

(58) Field of Classification Search
None
See application file for complete search history.

(56) References Cited

U.S. PATENT DOCUMENTS 6,005,182 A * 12/1999 Imanishi ................. H01L 35/08
136/200
2005/0139250 A1* 6/2005 DeSteese ................ H01L 35/08
136/212
(Continued)

FOREIGN PATENT DOCUMENTS

DE    10 2011 016886 A1   10/2012
EP         2874191 A2       5/2015
(Continued)

OTHER PUBLICATIONS

International Search Report issued in International Application No. PCT/FR2016/052255, dated Nov. 3, 2016, 3 pages.
(Continued)

*Primary Examiner* — Tamir Ayad
(74) *Attorney, Agent, or Firm* — Osha Liang LLP

(57) ABSTRACT

A thermoelectric device may include a casing of tubular shape in which extends a plurality of modules of thermoelectric elements extending parallel to a longitudinal axis of the casing. Additionally, each module may include a plurality of thermoelectric elements having a cylinder or right prism shape with a central opening, a first fluid circulating through the central opening, and a second fluid circulating around the exterior periphery, and an enclosure capping said thermoelectric elements. Further, the enclosure may include at least an intake for the second fluid and a discharge for said second fluid. Furthermore, a number and dimensions of said
(Continued)

thermoelectric element modules is optimized as a function of the ratio between a volume of the thermoelectric elements and a volume of the casing, a thickness of the enclosure and a distance between two adjacent modules.

16 Claims, 3 Drawing Sheets

(51) Int. Cl.
    *H01L 35/02*     (2006.01)
    *H01L 35/30*     (2006.01)
    *F01N 3/04*     (2006.01)

(56) References Cited

U.S. PATENT DOCUMENTS

2011/0308259 A1* 12/2011 Wray ............... F16L 55/103
    62/3.3
2014/0033702 A1* 2/2014 Limbeck ............. F01N 3/043
    60/597

FOREIGN PATENT DOCUMENTS

| FR | 3000614 A1 | 7/2014 |
| FR | 3010504 A1 | 3/2015 |
| FR | 3011983 A1 | 4/2015 |

OTHER PUBLICATIONS

Written Opinion issued in International Application No. PCT/FR2016/052255, dated Nov. 3, 2016, 5 pages.

* cited by examiner

THERMOELECTRIC MODULE AND DEVICE, IN PARTICULAR FOR
GENERATING AN ELECTRIC CURRENT IN
A MOTOR VEHICLE

BACKGROUND

The present invention relates to a thermoelectric module and a thermoelectric device, intended in particular to generate an electric current in a motor vehicle.

In the automotive field thermoelectric devices, also termed thermoelectric generators (TEG), have already been proposed using so-called thermoelectric elements enabling generation of an electric current in the presence of a temperature gradient between two of their opposite faces by the phenomenon known as the Seebeck effect. These devices comprise a stack of first tubes, intended for the circulation of the exhaust gases from an engine, and second tubes, intended for the circulation of a heat transfer fluid from a cooling circuit. The thermoelectric elements are sandwiched between the tubes so as to be subjected to a temperature gradient resulting from the temperature difference between the hot exhaust gases and the cold cooling fluid.

Such devices are of particular interest because they enable production of electricity by conversion of heat coming from the exhaust gases of the engine. They therefore offer the possibility of reducing the fuel consumption of the vehicle through being substituted, at least in part, for the alternator usually provided therein to generate electricity by means of a belt driven by the crankshaft of the engine.

Thermoelectric devices have already been developed including a plurality of thermoelectric modules, each module including thermoelectric elements of annular shape in which the first fluid and the second fluid circulate transversely relative to one another. A thermoelectric module of this kind includes a plurality of thermoelectric elements of annular shape disposed coaxially and longitudinally in line with one another, for example with an alternation of N-type thermoelectric elements and P-type thermoelectric elements. Each thermoelectric element includes fins extending transversely and radially from the exterior periphery. These fins, usually made of aluminum or stainless steel and crimped onto the outside diameter of the rings of the thermoelectric elements, make it possible to promote heat exchanges with the hot exhaust gases that flow across said fins, a cold fluid circulating at the center of the thermoelectric elements, and to extract the maximum heat from the exhaust gases to transfer it to the thermoelectric materials.

Said modules therefore include thermoelectric elements that are assembled in the form of cylindrical pencils and are distributed in a cylindrical enclosure so that the hot exhaust gases circulate freely between the modules while a heat transfer fluid from a cooling circuit circulates at the center of the thermoelectric elements.

SUMMARY OF DISCLOSURE

This type of thermoelectric device has a number of disadvantages. Additional thermal resistances are produced by all the connection elements needed between the heat transfer fluid circuit and the thermoelectric elements and/or the thermoelectric element pencils, thus degrading the effectiveness of the thermoelectric device. Moreover, the circulation of the exhaust gases is not the optimum. Actually, said exhaust gases are not diffused homogeneously between the thermoelectric element pencils or do not enable the exchange of heat over all of the surface of the thermoelectric elements, which also reduces the effectiveness of this type of thermoelectric device.

The invention proposes to improve on this situation and to that end concerns a thermoelectric device comprising at least one casing of tubular shape in which extends a plurality of modules of thermoelectric elements extending parallel to the longitudinal axis of the casing, each module being constituted on the one hand of a plurality of thermoelectric elements having a cylindrical or right prism shape having a central opening and being able to generate an electric current because of a temperature gradient inserted between a first, so-called exterior face defined by an exterior periphery surface and a second, so-called interior face defined by an interior periphery surface, a first fluid being intended to circulate through the central opening and a second fluid being intended to circulate around the exterior periphery, and on the other hand an enclosure capping said thermoelectric elements and including at least an intake for the second fluid and a discharge for said second fluid, the number and the dimensions of said thermoelectric element modules being optimized as a function of the ratio between the volume of the thermoelectric elements and the volume of the casing, the thickness of the enclosure and the distance between two adjacent modules.

Clearly, in contrast to the prior art devices, the enclosures capping the thermoelectric element pencils and in which the hot exhaust gases circulate enable on the one hand homogeneous diffusion of the exhausts gases between the thermoelectric elements and on the other hand exchange of heat over all of the surface of the thermoelectric elements and the design enables limitation of the connection elements needed between the heat exchange fluid circuit and the thermoelectric element pencils. Moreover, the effectiveness of the device is further improved by optimizing the number and the dimensions of said thermoelectric element modules as a function of the ratio between the volume of the thermoelectric elements and the volume of the casing, the thickness of the enclosure and the distance between two adjacent modules.

According to one aspect of the invention, the ends of the casing are closed by an intake manifold and/or a discharge manifold for a first fluid and/or an intake manifold and/or a discharge manifold for a second fluid, or even a return manifold for one of the fluids.

According to one aspect of the invention, the ratio between the volume of the thermoelectric elements and the volume of the casing is between 0.1 and 1 inclusive and preferably between 0.1 and 0.2 inclusive.

According to another aspect of the invention, the distance between the longitudinal axes of two adjacent thermoelectric element modules is between 15 mm and 60 mm inclusive and preferably between 25 mm and 30 mm inclusive.

According to one aspect of the invention, the distance between the enclosures of two adjacent thermoelectric element modules is between 0.5 and 30 mm inclusive and preferably between 0.5 and 1.5 mm inclusive.

The casing preferably has a right circular section and the thermoelectric element modules are preferably positioned circumferentially inside said casing around the revolution axis of said casing.

According to one aspect of the invention, the space between two adjacent thermoelectric element modules is blocked by application of a glue.

Alternatively, the space between two adjacent thermoelectric element modules is blocked by a metal part of V general shape the two wings of which bear on the enclosure of a respective thermoelectric element module.

Said enclosure is advantageously constituted of at least two assembled parts. Thanks to this design of the enclosure capping said thermoelectric element or elements, a dimensional clearance between the outside diameter of the fins of the thermoelectric elements and the inside diameter of the enclosure is not necessary because said thermoelectric elements are not inserted coaxially in the enclosure, thereby improving the exchanges of heat.

According to one aspect of the invention, said enclosure is constituted of at least two fractions of tubes of right circular or polygonal section and closed at its ends by a respective washer of complementary shape including at least two lugs extending outward from the periphery of said washer so as to form at least two slots between said tube fractions.

According to one embodiment, the thermoelectric elements have an annular shape and comprise fins crimped onto the exterior face of said thermoelectric elements, said fins extending perpendicularly to the revolution axis of said thermoelectric elements.

The interior wall of the enclosure advantageously bears on the fins. All of the exhaust gas flow therefore circulates across the fins of the thermoelectric elements.

According to one embodiment, the enclosure is constituted of two circular half-tubes and closed at its ends by two annular washers including two radial lugs on which the two half-tubes bear to form the intake slot and the discharge slot.

According to one aspect of the invention, the enclosure parts are made from a material having dielectric properties, in order to provide electrical insulation of the thermoelectric elements from the outside environment.

According to one aspect of the invention, said enclosure parts are produced in a material having a temperature resistance of at least 800° C.

Said material from which the enclosure parts are made advantageously consists of ceramic.

According to one aspect of the invention, said glue blocking the space between two adjacent thermoelectric element modules consists of a ceramic glue.

The intake slot and the discharge slot are advantageously arranged so that the passage section provided by the slots is equivalent to the passage section across the fins.

BRIEF DESCRIPTION OF DRAWINGS

The invention will be better understood in the light of the following description which is given by way of illustration only and not to limit it, accompanied by the appended drawings in which.

DETAILED DESCRIPTION

Figure 1:
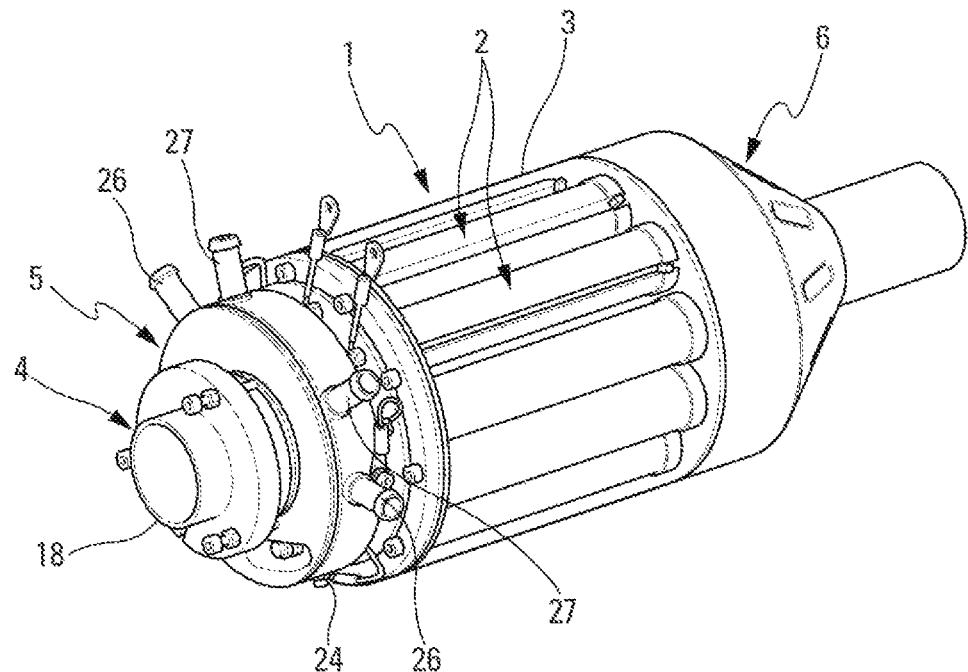
FIG. 1 is a perspective view of a thermoelectric device according to the invention comprising a plurality of thermoelectric element modules.

In the figures, identical or analogous elements carry the same references.

The invention concerns a thermoelectric device 1 shown in FIGS. 1 and 2 comprising a plurality of parallel modules 2 described in detail hereinafter positioned circumferentially inside a casing 3 of tubular shape the ends of which are closed by an intake manifold 4 for a first fluid, in this instance hot exhaust gases, and an intake manifold 5 for a second fluid, namely a heat transfer fluid from a cooling circuit, and by a respective discharge manifold 6 for said first and second fluids. The casing 3 has a right circular section and the thermoelectric element modules 2 are positioned circumferentially inside said casing 3 around the revolution axis of said casing 3.

Figure 3:
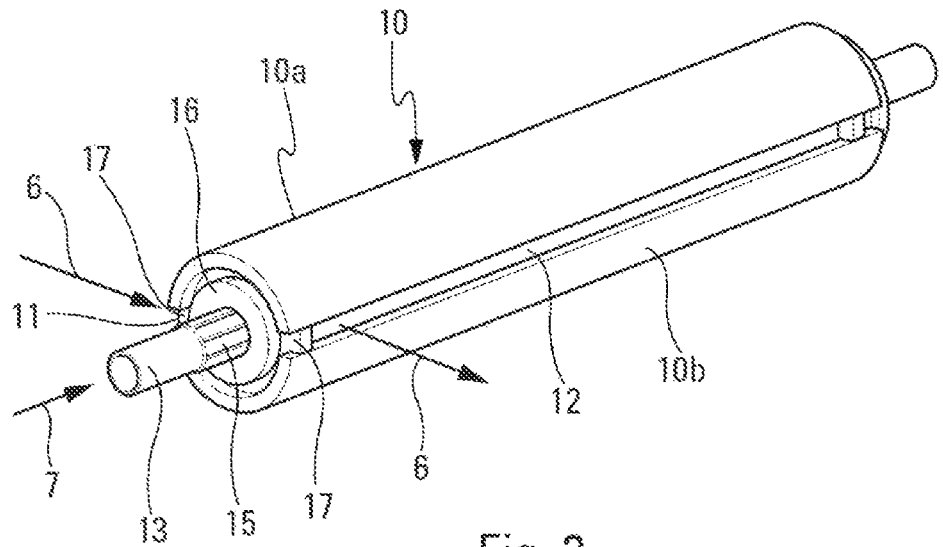
FIG. 3 is a perspective view of one embodiment of a module of the thermoelectric device according to the invention.
Figure 4:
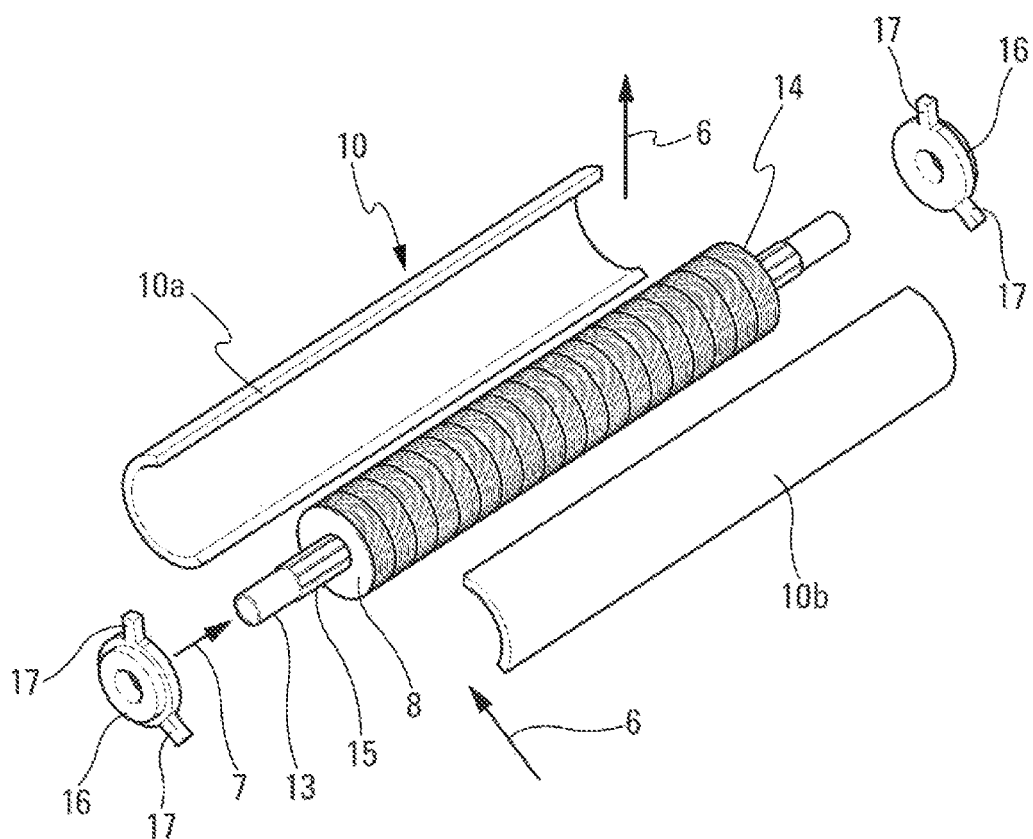
FIG. 4 is an exploded perspective view of a module of the thermoelectric device according to the invention.
Figure 5:
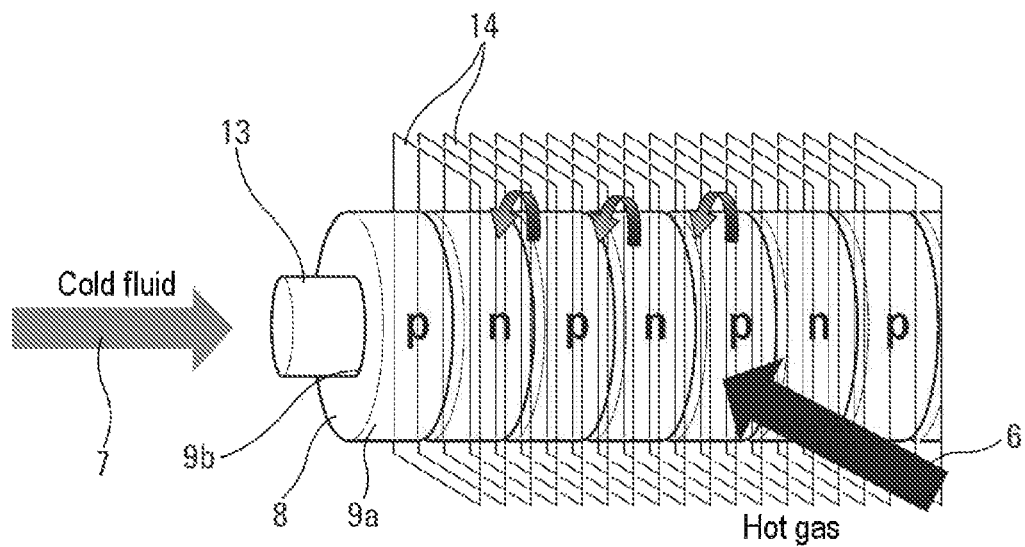
FIG. 5 illustrates diagrammatically a thermoelectric module conforming to the invention constituted of a plurality of annular thermoelectric elements and radial fins, with no enclosure.

Referring to FIGS. 3 to 5, each module 2 comprises a first, so-called hot circuit 6 adapted to allow the circulation of a first fluid, in particular exhaust gases from an engine, and a second, so-called cold circuit 7 adapted to allow the circulation of a second fluid, in particular a heat transfer fluid from a cooling circuit, at a temperature below that of the first fluid. Said second fluid therefore has a higher coefficient of thermal exchange than said first fluid.

Said module 2 comprises at least one thermoelectric element 8, here a plurality of thermoelectric elements 8n, 8p, of cylinder or right prism shape and having a central opening, able to generate an electric current because of a temperature gradient exerted between a first, so-called exterior face 9a defined by an exterior periphery surface and a second, so-called interior face 9b defined by an interior periphery surface, the second fluid being intended to circulate through the central opening and the first fluid being intended to circulate around the exterior periphery, and an enclosure 10 capping said thermoelectric element or elements 8, constituted of at least two assembled parts 10a, 10b, and including at least a first, so-called intake slot 11 for the second fluid and a second, so-called discharge slot 12 for said second fluid.

It will be noted that the exterior face 9a and the interior face 9b of the thermoelectric elements 8 are for example circular. However, more generally, any section of rounded shape, such as an oval shape for example, and/or a polygonal shape is possible.

Such elements function in accordance with the Seebeck effect, enabling creation of an electric current in a load connected between the interior face 9b and the exterior face 9a of the thermoelectric elements 8n, 8p subjected to the temperature gradient. In a manner known to a person skilled in the art, such elements are constituted, for example, of bismuth and tellurium ($Bi_2Te_3$).

The thermoelectric elements 8 could be, for a first part, elements 8p of a first, so-called P type enabling an electric potential difference to be established in one, so-called positive direction when they are subjected to a given temperature gradient and, for the other part, elements 8n of a second, so-called N type enabling the creation of an electric potential difference in an opposite, so-called negative direction, when they are subjected to the same temperature gradient.

The thermoelectric elements 8 represented in FIGS. 4 and 5 are constituted of a one-piece ring. They could however take the form of a plurality of parts each forming an angular portion of the ring.

The exterior surface 9a has, for example, a radius between 1.5 and 4 times inclusive the radius of the interior surface 9b. It could be a radius equal to approximately twice that of the interior surface 9b.

Said thermoelectric element 8 has, for example, two opposite parallel plane faces. In other words, the ring constituting the thermoelectric element 8 is of rectangular annular section.

Said thermoelectric elements 8p, 8n are disposed, for example, longitudinally in line with one another, notably coaxially, and the thermoelectric elements of type P alternate with the thermoelectric elements of type N, in a direction D. They in particular have identical shapes and dimensions. They could however have a thickness, that is to say a dimension between their two plane faces, different from one type to the other, in particular as a function of their electrical conductivity.

Said thermoelectric elements 8p, 8n are, for example, grouped in pairs, each pair being formed of one of said P-type thermoelectric elements and one of said N-type thermoelectric elements, and said module is configured to enable circulation of current between the first surfaces of the thermoelectric elements 1 of the same pair and circulation of current between the second surfaces of each of the thermoelectric elements 8 of said same pair and the adjacent thermoelectric element 8 of the adjacent pair. This ensures series circulation of the electrical current between the thermoelectric elements 8p, 8n disposed alongside one another in the direction D.

For the circulation of the fluids, the module according to the invention could comprise a channel 13 for circulation of cold liquid in contact with said second surface 9b of said thermoelectric elements 8p, 8n.

According to the foregoing, the single cold liquid circulation channel 13 is placed at the center of the module. Alternatively, a plurality of cold liquid circulation channels could be provided.

Said liquid circulation channel or channels 13 are, for example, of circular section.

In FIGS. 4 and 5, it is seen that said module 2 comprises cold liquid circulation tubes 13 on which are mounted a plurality of thermoelectric elements 8 of the same type alternating in the longitudinal direction D in which the tube 13 extends with a thermoelectric element of the other type. The tubes 13 are, in particular, metal tubes. They define said channel at least in part.

Said module 2 could further comprise electrical insulating means, not represented in the figures, disposed between two facing faces of adjacent thermoelectric elements 8p, 8n in the longitudinal direction D in which the tube 13 extends.

Said module 2 could further comprise first electrical connecting means, not represented in the figures, connecting the exterior periphery surfaces 9a of two adjacent thermoelectric elements 8 of different types. Said first electrical connecting means comprise, for example, a layer of electrically conductive material, notably of copper and/or of nickel, covering said thermoelectric elements 8p, 8n.

Said module 2 advantageously comprises secondary exchange surfaces, in particular fins 14, for exchanges with the second fluid. This increases the area of exchange between the thermoelectric elements 8 and said second fluid. Said fins 14 are disposed, for example, transversely, in particular radially relative to said thermoelectric elements 8. Here they are positioned parallel to one another with a spacing enabling good exchange of heat with the second fluid whilst limiting head losses. Said fins 14 could be off-center relative to said thermoelectric elements 8p, 8n, in particular elongated on the side from which the second fluid arrives.

Said fins 14 could comprise a catalytic coating for catalytic conversion of toxic components of the second fluid. In the case of exhaust gas, said module 2 could thus equip a catalytic converter in addition to or instead of catalysis components conventionally used in such equipments.

Said fins 14 are fixed, for example, to said first electrical connecting means, notably by crimping and/or brazing.

The module 2 could further comprise second electrical connecting means 15 establishing an electrical connection between the interior periphery surfaces 9b of two adjacent thermoelectric elements 8 of different types and not connected by said first electrical connecting means.

In other words, said first and second electrical connecting means connect said thermoelectric elements 8 two by two so as to establish a series electric circuit between said thermoelectric elements 8 of the module 2.

As already mentioned, with reference to FIGS. 3 and 4, the enclosure 10 consists of at least two assembled parts 10a, 10b, and includes at least a first, so-called intake slot 11 for the second fluid and a second, so-called discharge slot 12 for said second fluid. Thanks to this design of the enclosure 10 capping said thermoelectric element or elements 8, it is not necessary to have a dimensional clearance between the outside diameter of the fins of the thermoelectric elements and the inside diameter of the enclosure since said thermoelectric elements are not inserted in the enclosure coaxially.

According to the embodiment represented in FIG. 3, said enclosure 10 is constituted of two parts 10a, 10b corresponding to a respective right circular section tube fraction, each tube fraction being substantially semicylindrical, and closed at its respective ends by a washer 16 of complementary shape, that is to say of circular shape, including at least two lugs 17 extending outwards from the periphery of said washer 16 in such a manner as to form at least two slots 11 and 12 between said tube fractions 10a, 10b. The enclosure 10 is therefore constituted of two circular half-tubes 10a, 10b and closed at its ends by two annular washers 16 with two radial lugs 17 on which the two half-tubes 10a, 10b bear to form the intake slot 11 and the discharge slot 12 for the second fluid. In this embodiment, the two lugs 17 of the washers 16 are diametrically opposite and so the intake slot 11 extends from the side opposite the discharge slot 12.

However, referring to FIG. 4, the position of the lugs 17 of the washers 16 can be any position as a function of the required angular position between the intake slot 11 and the discharge slot 12 for the exhaust gases. In the embodiment represented in FIG. 4, said lugs 17 form an angle of approximately 120° so that a first tube fraction 10a has a right tube section subtending approximately 240° and the second tube fraction 10b has a right tube section subtending approximately 120°.

The interior wall of the enclosure 10 advantageously bears on the fins 14. All of the flow of exhaust gas therefore circulates across the fins 14 of the thermoelectric elements 8.

Moreover, the parts 10a, 10b of the enclosure 10 are made from a material having dielectric properties in order to insulate the thermoelectric elements 8 electrically from the outside environment. Moreover, said parts 10a, 10b of the enclosure are made from a material having a temperature resistance of at least 800° C. The parts 10a, 10b of the enclosure 10 are therefore preferably made from molded ceramic, extruded mica or alumina.

The intake slot 11 and the discharge slot 12 are advantageously arranged so that the passage section provided by the slots 11 and 12 is equivalent to the passage section across the fins 14.

Figure 2:
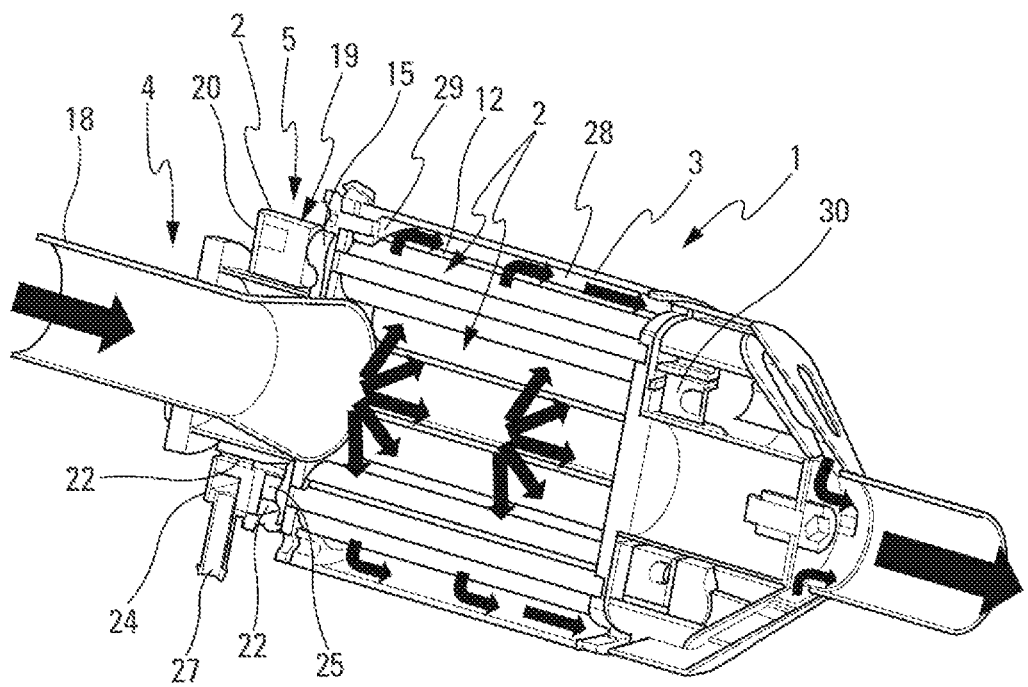
FIG. 2 is a perspective view in elevation of the thermoelectric device according to the invention.

As already mentioned, with reference to FIGS. 1 and 2, the thermoelectric device 1 comprises a plurality of parallel modules 2 as described above positioned circumferentially inside a casing 3 of tubular shape the ends of which are closed by an intake manifold 4 for a first fluid and an intake manifold 5 for a second fluid and by a discharge respective manifold 6 for said first and second fluids.

Said intake manifold 4 for the first fluid consists of a tapered a cylindrical nozzle 18 leading to the casing 3 and the manifold 5 for the second fluid is constituted of a box 19 of cylindrical ring shape, including two lateral walls 20, 21 that have the shape of a disk with a circular central hole 22, a cylindrical interior wall 23 and a cylindrical exterior wall 24, holes 25 formed in one of the lateral walls 21 to receive the central tubes 13 of the thermoelectric c modules 2, said holes 25 being provided with sealing means, not represented in the figures. Moreover, said box 19 includes at least one internal partition defining at least one so-called intake chamber and one so-called discharge chamber and at least one so-called intake tube 26 leading into the intake chamber and one so-called discharge tube 27 leading into the discharge chamber. The intake tube 26 and the discharge tube 27 extend radially from the exterior peripheral wall 24 of the box 19.

The discharge manifold 6 has a conical shape and communicates with gutters 28 extending between two contiguous thermoelectric element 8 modules 2 respectively including an intake slot 29 in fluid communication with the discharge slot 12 of a module 2. Said discharge manifold 6 also includes an internal ring 30 including holes receiving the central tubes 13 of the thermoelectric modules 2 in which circulates the second fluid, namely the heat transfer fluid from the cooling circuit, said ring 30 including internal walls, not represented in the figures, to establish communication between the central tubes 13 of the modules 2.

Figure 6:
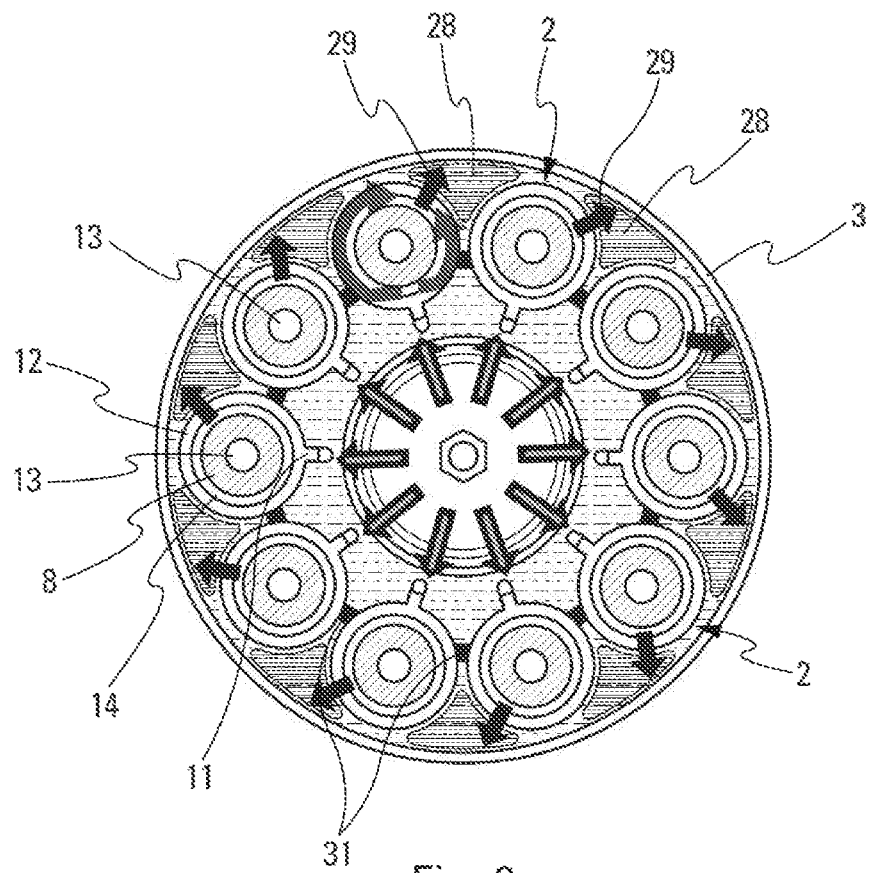
FIG. 6 illustrates diagrammatically, in cross section, an example of a thermoelectric device according to the invention.

Referring to FIG. 6, the first fluid, namely the hot exhaust gases, is therefore introduced into the casing 3 via the intake manifold 4 at the center of the thermoelectric element modules 2 and is then introduced into the enclosures 10 of said modules 2, passing through the intake slots 11 of said enclosures 10. The first fluid passes across all the fins 14 before leaving the enclosures 10 via the discharge slots 12 and being recovered by the gutters 28 and evacuated via the discharge manifold 6. At the same time, the second fluid, namely the heat transfer fluid from the cooling circuit, is introduced into the intake manifold 4 via the intake tubes 26 so that it circulates in the central tubes 13 via the internal ring 30 before it escapes via the discharge tubes 27.

In order to prevent some of the exhaust gases stagnating between the modules 2, inside the casing 3, the space between two adjacent thermoelectric element modules 2 is blocked by application of a glue, such as a ceramic glue for example, to form a longitudinal plug 31.

As an alternative, not represented in the figures, the space between two adjacent thermoelectric element modules 2 is blocked by a metal part of V general shape the two wings of which bear on the enclosure 10 of a respective thermoelectric element module 2.

For optimum effectiveness of the thermoelectric device according to the invention, the number and the dimensions of said thermoelectric element modules 2 are optimized as a function of the ratio between the volume of the thermoelectric elements and the volume of the casing 3, the thickness of the enclosure 10 and the distance between two adjacent modules 2.

Clearly the enclosures 10 capping the thermoelectric element pencils in which the hot exhaust gases circulate enable on the one hand homogeneous diffusion of the exhaust gases between the thermoelectric elements and on the other hand exchange of heat over all the surface of the thermoelectric elements, and the design enables limitation of the connecting elements needed between the heat transfer fluid circuit and the thermoelectric element pencils.

In this embodiment, the thermoelectric device includes ten modules distributed circumferentially around the central exhaust gas pipe in the casing 3 the effective volume of which, that is to say the interior volume of the casing 3 of which, is 2000 cm$^3$.

For maximum effectiveness of the thermoelectric device according to the invention, the ratio between the volume of the thermoelectric elements and the volume of the casing 3 is between 0.1 and 1 inclusive and preferably between 0.1 and 0.2 inclusive, the distance between the longitudinal axes of two adjacent thermoelectric element modules 2 is between 15 mm and 60 mm inclusive and preferably between 25 mm and 30 mm inclusive, and the distance between the enclosures 10 of two adjacent thermoelectric element modules 2 is between 0.5 and 30 mm inclusive and preferably between 0.5 and 1.5 mm inclusive.

It is clear that the present invention is not in any way limited to the embodiments described above and that many modifications may be made thereto without departing from the scope of the appended claims.

What is claimed:

1. A thermoelectric device comprising:
    at least one casing of tubular shape in which extends a plurality of modules of thermoelectric elements extending parallel to a longitudinal axis of the casing,
    each module being constituted of a plurality of thermoelectric elements having a cylindrical or right prism shape having a central opening,
    each module being configured to generate an electric current due to a temperature gradient between a first exterior face defined by an exterior periphery surface and a second interior face defined by an interior periphery surface,
    wherein a first fluid circulates through the central opening and a second fluid circulates around the exterior periphery surface,
    each module being further constituted by an enclosure capping said thermoelectric elements and including at least an intake for the second fluid and a discharge for said second fluid,
    wherein a number of the plurality of modules of the thermoelectric elements and dimensions of the plurality of modules of the thermoelectric elements are optimized as a function of a ratio between a volume of the thermoelectric elements and a volume of the casing, a thickness of the enclosure, and a distance between two adjacent modules, and
    wherein the enclosure is constituted of two assembled parts, wherein the two assembled parts are two circular half-tubes, are two circular half-tubes, and wherein ends of the enclosure are closed by two annular washers including two radial lugs on which the two half-tubes contact to form an intake slot and a discharge slot.

2. The device as claimed in claim 1, wherein the ratio between the volume of the thermoelectric elements and the volume of the casing is between 0.1 and 1 inclusive.

3. The device as claimed in claim 2, wherein the ratio between the volume of the thermoelectric elements and the volume of the casing is between 0.1 and 0.2 inclusive.

4. The device as claimed in claim 1, wherein a distance between the longitudinal axes of two adjacent thermoelectric element modules is between 15 mm and 60 mm inclusive.

5. The device as claimed in claim 4, in which the distance between the longitudinal axes of two adjacent thermoelectric element modules is between 25 mm and 30 mm inclusive.

6. The device as claimed in claim 1, wherein a distance between the enclosures of two adjacent thermoelectric element modules is between 0.5 and 30 mm inclusive.

7. The device claimed in claimed claim 6, wherein the distance between the enclosures of two adjacent thermoelectric element modules is between 0.5 and 1.5 mm inclusive.

8. The device as claimed in claim 1, wherein the casing has a right circular section and the thermoelectric element modules are positioned circumferentially inside said casing around a revolution axis of said casing.

9. The device as claimed in claim 1, wherein a space between two adjacent thermoelectric element modules is filled by application of a glue to form a plug.

10. The device as claimed in claim 1, wherein a metal part having a V-shape is inserted in a space between two adjacent thermoelectric element modules, wherein two wings of the V-shape contact the enclosure of a respective thermoelectric element module.

11. The device as claimed in claim 1, wherein the thermoelectric elements have an annular shape and comprise fins crimped onto an exterior face of said thermoelectric elements, said fins extending perpendicularly to a revolution axis of said thermoelectric elements.

12. The device as claimed in claim 11, wherein an interior wall of the enclosure contacts the fins.

13. The device as claimed in claim 1, wherein the two assembled parts of the enclosure are made from a material having dielectric properties.

14. The device as claimed in claim 13, wherein said material has a temperature resistance of at least 800° C.

15. The device as claimed in claim 13, wherein said material consists of ceramic.

16. The device as claimed in claim 15, wherein said glue consists of a ceramic glue.

* * * * *